United States Patent
Entenmann et al.

(10) Patent No.: US 9,908,438 B2
(45) Date of Patent: Mar. 6, 2018

(54) CONTROL DEVICE FOR CONTROLLING AN ADJUSTABLE SEAT OF A MOTOR VEHICLE

(71) Applicant: DAIMLER AG, Stuttgart (DE)

(72) Inventors: Volker Entenmann, Affalterbach (DE); Volker Gerhardt, Schönaich (DE); Jörg Reisinger, Löchgau (DE); Tingting Zhang-Xu, Sindelfingen (DE)

(73) Assignee: DAIMLER AG, Stuttgart (DE)

( * ) Notice: Subject to any disclaimer, the term of this patent is extended or adjusted under 35 U.S.C. 154(b) by 84 days.

(21) Appl. No.: 15/025,719

(22) PCT Filed: Aug. 27, 2014

(86) PCT No.: PCT/EP2014/002336
§ 371 (c)(1),
(2) Date: Mar. 29, 2016

(87) PCT Pub. No.: WO2015/043709
PCT Pub. Date: Apr. 2, 2015

(65) Prior Publication Data
US 2016/0229312 A1 Aug. 11, 2016

(30) Foreign Application Priority Data
Sep. 30, 2013 (DE) .................. 10 2013 016 340

(51) Int. Cl.
*B60N 2/00* (2006.01)
*B60N 2/02* (2006.01)
*H03K 17/965* (2006.01)

(52) U.S. Cl.
CPC ......... *B60N 2/0228* (2013.01); *B60N 2/0232* (2013.01); *H03K 17/965* (2013.01)

(58) Field of Classification Search
None
See application file for complete search history.

(56) References Cited

U.S. PATENT DOCUMENTS 6,388,655 B1  5/2002  Leung
7,390,982 B2  6/2008  Schmidt et al.
(Continued)

FOREIGN PATENT DOCUMENTS

CN    1387659 A    12/2002
DE    19806479 C1   7/1999
(Continued)

OTHER PUBLICATIONS

International Search Report dated Dec. 2, 2014 in related International Application No. PCT/EP2014/002336.
(Continued)

*Primary Examiner* — James M McPherson
(74) *Attorney, Agent, or Firm* — Patent Portfolio Builders PLLC

(57) ABSTRACT

An operating device for operating an adjustable seat of a motor vehicle includes a carrier, an operating element having a surface, and at least one holding element coupling the operating element to the carrier at a bearing position on the carrier. The operating device also includes a sensor configured to detect a size of a force acting on the operating element surface during an operating input and to generate a signal corresponding to the size of the detected force. The sensor is integrated into the bearing position on the carrier. The operating device further includes seat adjuster configured to adjust the adjustable seat based on the size of the detected force.

20 Claims, 5 Drawing Sheets

(56) References Cited

U.S. PATENT DOCUMENTS

Figure 3A:
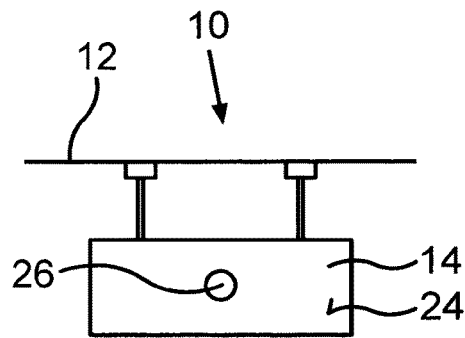

| | | | |
|---|---|---|---|
| 7,432,459 B2 | 10/2008 | Stoschek et al. | |
| 2005/0284737 A1* | 12/2005 | Shitanaka | H01H 25/04 |
| | | | 200/5 R |
| 2006/0186737 A1* | 8/2006 | Schmidt | H01H 23/003 |
| | | | 307/10.1 |
| 2007/0235297 A1* | 10/2007 | Stoschek | B60N 2/0228 |
| | | | 200/5 R |
| 2010/0066137 A1* | 3/2010 | Sakai | B60N 2/002 |
| | | | 297/217.3 |

FOREIGN PATENT DOCUMENTS

| | | |
|---|---|---|
| DE | 102005044599 A1 | 3/2006 |
| EP | 1839941 A2 | 10/2007 |
| WO | 0135328 A1 | 5/2001 |

OTHER PUBLICATIONS

Written Opinion dated Dec. 2, 2014 in related International Application No. PCT/EP2014/002336.
Office Action dated Feb. 22, 2017 in related CN Application No. 201480053708.1.

* cited by examiner

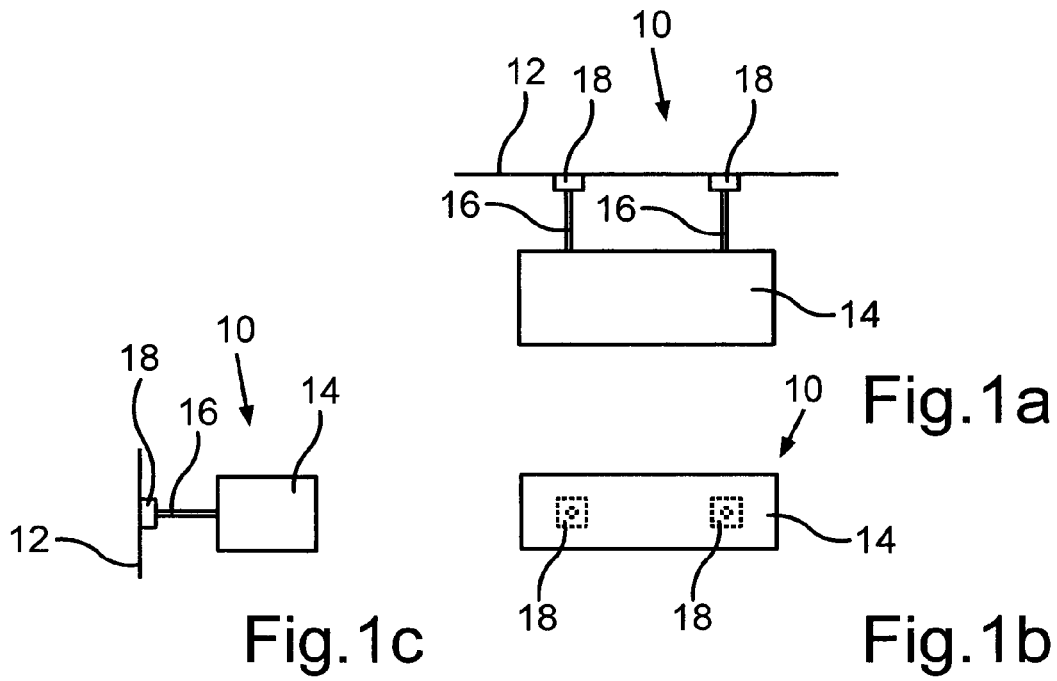
Fig.1a
Fig.1b
Fig.1c
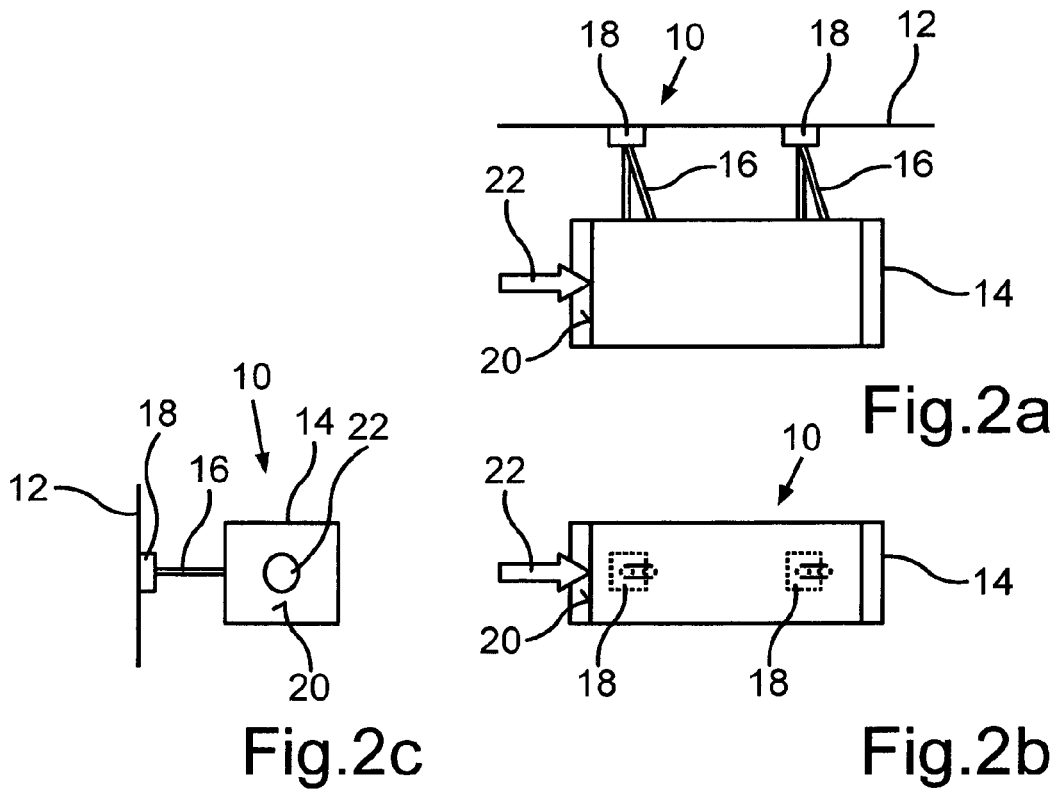
Fig.2a
Fig.2b
Fig.2c

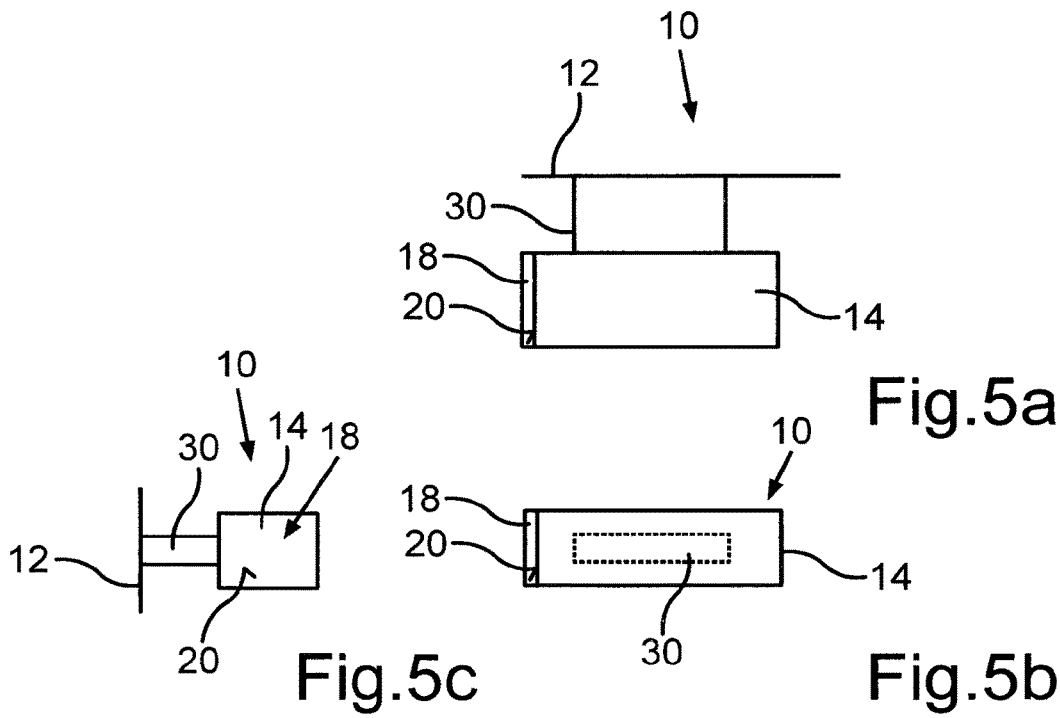
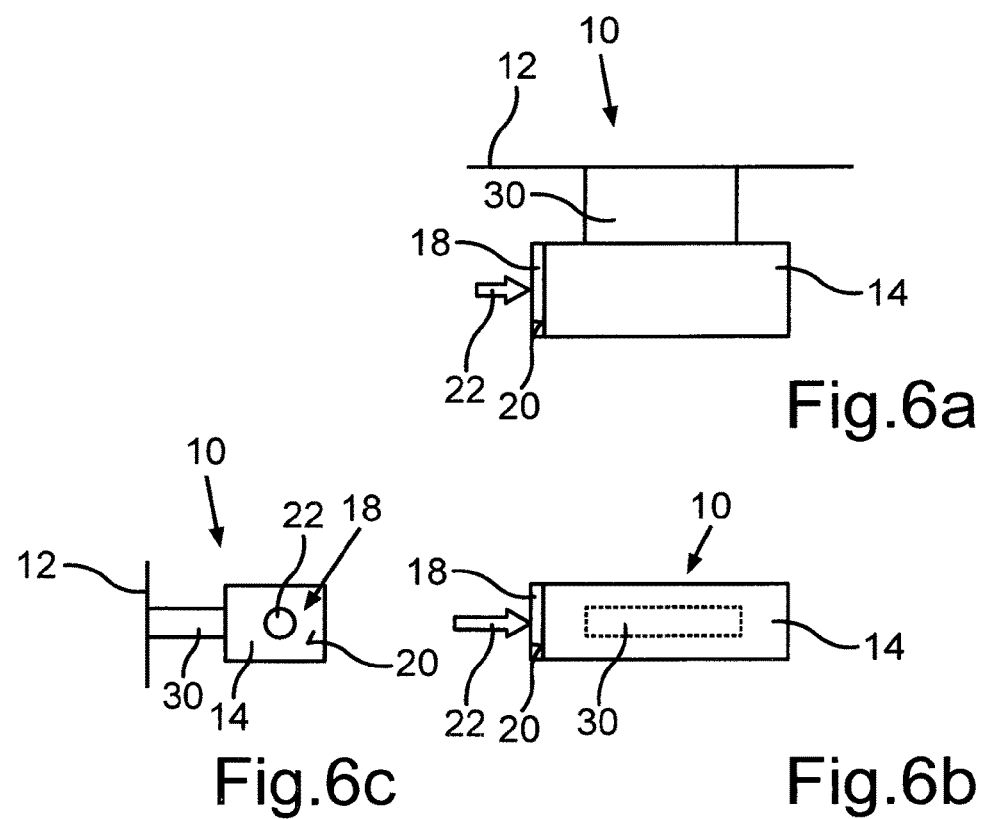

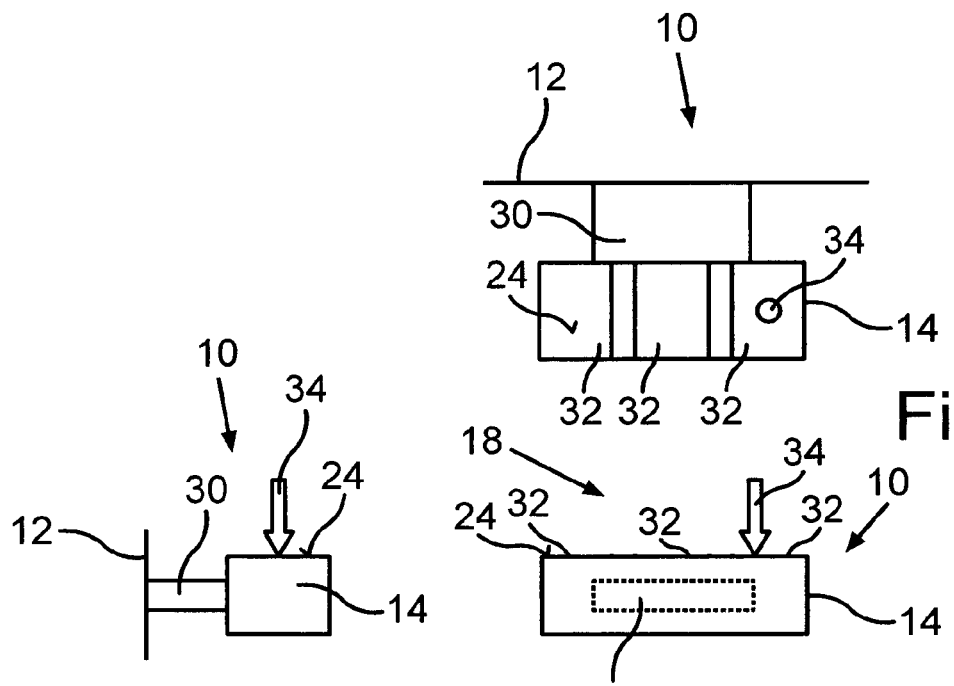
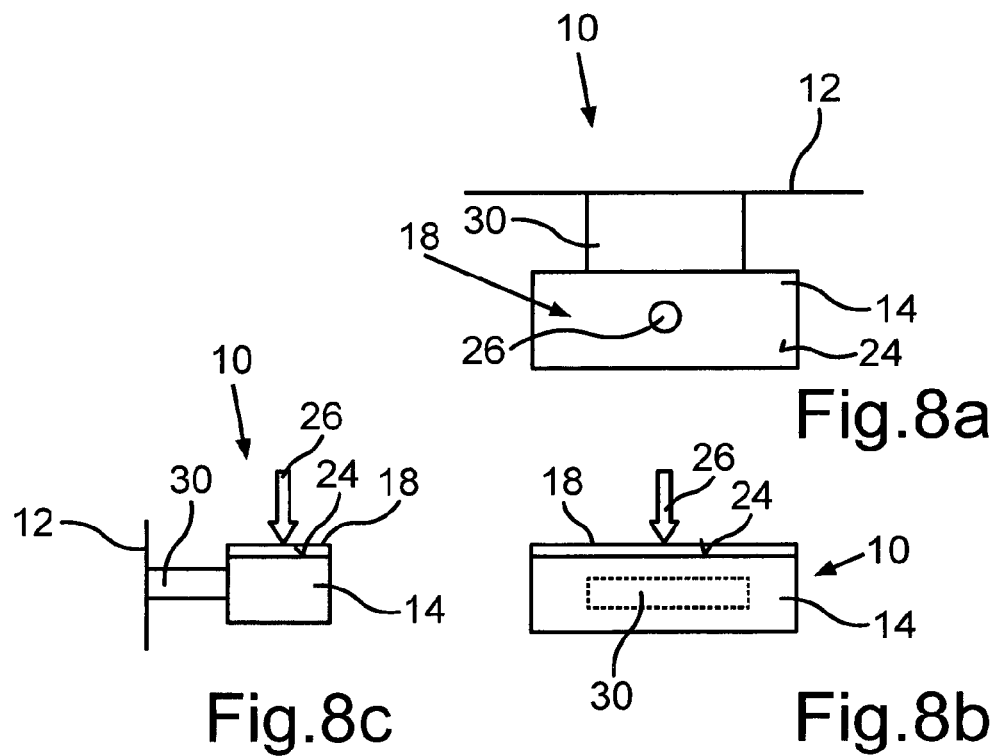

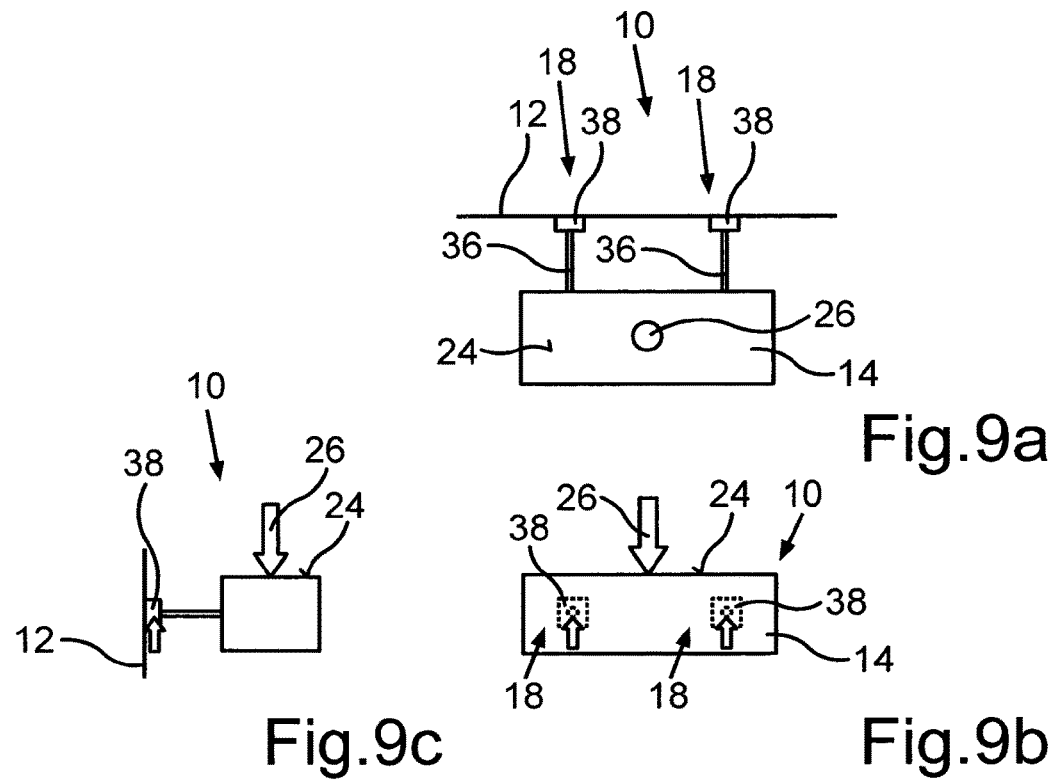
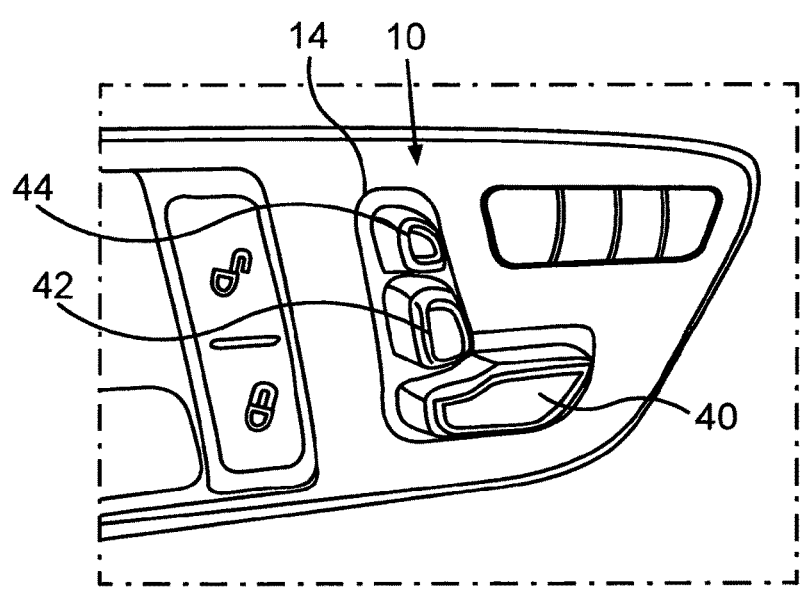

CONTROL DEVICE FOR CONTROLLING AN ADJUSTABLE SEAT OF A MOTOR VEHICLE

BACKGROUND AND SUMMARY OF THE INVENTION

Exemplary embodiments of the present invention relate to an operating device to operate an adjustable seat of a motor vehicle.

Modern motor vehicles are increasingly equipped with electrically adjustable seats. The adjustable seats comprise, for example, electric motors with which the seat cushion, the backrest and the head support can be adjusted. The adjustable seats can be adjusted using a corresponding operating device, i.e., a seat adjustment switch. The operating devices have a corresponding operating element and a sensor device with which an operating input can be detected at the operating element.

Currently, such seat adjustment switches have a mechanical operating element, can be formed by a keycap mounted on a four-way adjuster and guided linearly. The triggering of a function requires a movement of the keycap and the overcoming a trigger force. To ensure a secure resetting of the deflected keycap under all temperature conditions, due to the high friction in the linear guides, the force level for the actuation or operation must be raised so significantly that operating comfort suffers. This is contrary to the general desire for a force-reduced operation of the operating elements in a motor vehicle.

German patent document DE 10 2005 044 599 A1 discloses a control unit for selective adjustment of an automatically adjustable seat for a motor vehicle. The control unit has a seat adjustment device with several contactless sensors that are selectively provided. Each sensor is attached to an inner surface of a selection region in a corresponding recess and generates a signal selectively on actuation. The signal of each sensor is selectively allocated to a predetermined seat adjustment function.

Exemplary embodiments of the present invention are directed to an operating device for operating an adjustable seat of a motor vehicle that allows a simple, intuitive and reliable operation of the adjustable seat.

According to one aspect, an operating device to operate an adjustable seat of a motor vehicle has a carrier element; an operating element having a surface arranged on an outer surface of the carrier element; a sensor device to detect a size of a force acting on the surface during the operating input and to generate a signal corresponding to the size of the detected force; an evaluation device to generate a control signal by processing the signal corresponding to the size of the detected force; and an adjustment device to adjust the adjustable seat on the basis of the control signal.

The carrier element of the operating device can be arranged on a door interior trim. Likewise, it is also possible that the carrier element is part of a door interior trim. The carrier element can also be arranged on the dashboard, the central console or on the side of the adjustable seat, in particular a seat cushion. An operating element is preferably arranged rigidly on the carrier element. In other words, the operating element is not formed to be moveable with respect to the carrier element. The operating element can be formed as a corresponding keycap. The operating element can replicate the shape of a seat of a motor vehicle.

An operating input on the surface of the operating element can be detected using the sensor device of the operating device. A force can be detected using the sensor device, the force being exerted, for example, during the operating input with a finger on the surface of the operating element. An amplitude of the force can thereby also be detected using the sensor device. Depending on the detected operating input, a corresponding control signal is provided for the adjustment device of the seat. Therefore, a corresponding seat element of the seat can be adjusted by light pressure on the surface of the operating element. The function feedback thereby occurs directly through the moving seat. The influence of frictional forces on the operating forces can be eliminated by the pathless operating element. A low, pleasant level can therefore be selected for the trigger force. At the same time, the force sensitivity offers high operating security.

The sensor device can be formed such that the electrical resistance of the sensor device is changed by the influence of pressure on the sensor device. Such sensor devices are known as a force sensitive resistor. The sensor device can alternatively also be formed such that the deformations of the surface under the influence of force can be detected using capacitive sensors.

According to one embodiment, the adjustment device controls an adjustment speed of the adjustable seat depending on the size of the force acting on the surface.

The adjustment of the seat can thereby be selected such that the adjustment speed with which the seat is adjusted occurs proportional to the size of the force exerted on the operating element. This enables a particularly comfortable adjustment of the seat.

According to a further design, the sensor element detects a position at which the operating input is implemented on the surface, and emits the signal corresponding to the size of the detected force to the evaluation device depending on the detected position.

For example, a sliding of the corresponding part of the seat can therefore be caused by an operation in a central region of the operating element. If a contact on the edge region of the operating element is detected, an adjustment of the inclination of the associated part of the seat can be caused by the adjustment device. This enables a particularly precise adjustment of the seat.

According to a further design, an inclination of the adjustable seat is adjusted using the adjustment device if the detected position is a predetermined edge region of the surface.

According to a further design, the sensor device has sensor surfaces separated from one another and which each detect the size of the force acting on the surface.

Several predetermined regions can therefore be provided, wherein a sensor surface of the sensor device is arranged on each region. Operating inputs at different positions can therefore be reliably recognised and the adjustment device can be operated reliably depending on the detected operating input.

According to a further design, the sensor device is arranged on the surface of the operating element.

According to a further design, the operating element is arranged with at least one holding element on the carrier element and the sensor element detects a force acting on the holding element.

The operating element can therefore be arranged rigidly or fixedly on the carrier element with the at least one holding element. The operating element can, for example, be mounted rigidly on the outer surface of the carrier element with two holding elements. The holding elements can be fastened to the carrier element by corresponding bearing positions. Force sensors can be arranged in a region of the rigid bearing positions, by means of which an operating input exerted on the surface of the operating element can be detected. The sensor device can also be arranged directly on the at least one holding element. Therefore a robust and cost-effective variant for an operating device can be provided for operating an adjustable seat.

According to a further design, the surface expands substantially perpendicularly to the outer surface of the carrier element.

According to a further embodiment, the operating element has a first operating part to operate a seat cushion of the adjustable seat and a second operating part to operate a backrest of the adjustable seat.

According to a further embodiment, the operating element has a third operating part to operate a head support of the adjustable seat.

The operating element can have the shape of a seat of a motor vehicle. Each of the operating parts can comprise a sensor device or a corresponding sensor with which an actuating force of at least one side surface of the respective operating part can be detected. This enables a simple and intuitive adjustment of the seat.

The present invention is explained below in more detail by means of embodiments with reference to the enclosed drawings in which identical or corresponding parts are referred to with the same reference numerals consistently throughout the several views.

BRIEF DESCRIPTION OF THE DRAWING FIGURES

Figure 4A:
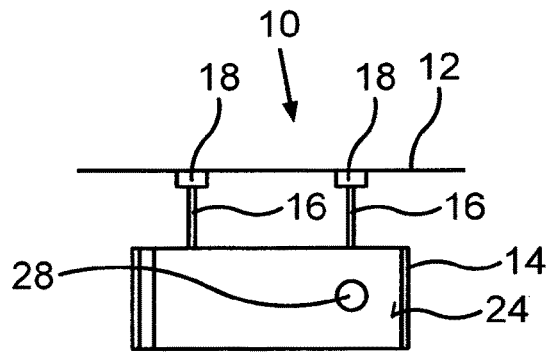

Here are shown:

FIG. 1a, b, c an operating device to operate an adjustable seat of a motor vehicle according to prior art;

FIG. 2a, b, c the operating device according to FIGS. 1a, 1b and 1c in a first operating state;

FIG. 3a, b, c the operating device according to FIGS. 1a, 1b and 1c in a second operating state;

FIG. 4a, b, c the operating device according to FIGS. 1a, 1b and 1c in a third operating state;

FIG. 5a, b, c an operating device to operate an adjustable seat of a motor vehicle according to a first embodiment;

FIG. 6a, b, c the operating device according to FIGS. 5a, 5b, and 5c in a first operating state;

FIG. 7a, b, c the operating device according to FIGS. 5a, 5b and 5c according to a second embodiment;

FIG. 8a, b, c the operating device according to FIGS. 5a, 5b and 5c according to a third embodiment;

FIG. 9a, b, c an operating device according to a fourth embodiment; and

FIG. 10 a perspective depiction of the operating device according to one design of the first to fourth embodiments.

DETAILED DESCRIPTION

FIGS. 1a, 1b and 1c show an operating device 10 to operate an adjustable seat of a motor vehicle according to prior art. The seat is, in particular, able to be adjusted electrically by an adjustment device. FIG. 1a shows a top view of the operating device 10, FIG. 1b a front view of the operating device 10, and FIG. 1c a side view of the operating device 10. The operating device 10 comprises a carrier element 12, which can be arranged, for example, on a door interior trim of a motor vehicle. The carrier element 12 can also be part of the door interior trim of the motor vehicle. Furthermore, the operating device 10 comprises an operating element 14 arranged on the carrier element 12 by an actuator rod 16. Furthermore, the operating device 10 comprises a sensor device 18, with which a movement or a deflection of the actuator rod 16 can be detected. In the present example, the sensor device 18 is formed as a four-way switch.

The operating device 10 presently serves to adjust a seat cushion of the seat of a motor vehicle. Adjusting the seat cushion in the horizontal direction requires an operating input on a first side surface 20 of the operating element 14. This operating state is illustrated in FIGS. 2a, 2b and 2c, which show a corresponding deflection of the operating device 10 according to FIGS. 1a, 1b and 1c. The application of force, which is exerted, for example, by the finger of the operator or of a vehicle passenger on the first side surface 20 of the operating element 14, is illustrated by the arrow 22 in the present case. The operating element 14 must be shifted by the force acting on the first side surface 20 until a trigger force of the sensor device 18 or of the four-way switch is exceeded and the electric switching point is reached. The connection between adjustment path and trigger force is thereby defined by the force-path characteristics of the two four-way switches. The movement of the operating element 14 is transferred to the two four-way switches by the lateral actuation such that the forces thereof are added together.

Figure 3C:
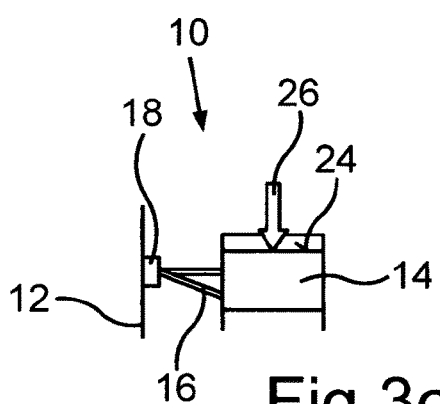
Figure 3B:
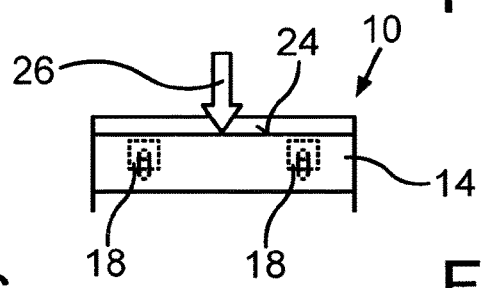
Figure 4C:
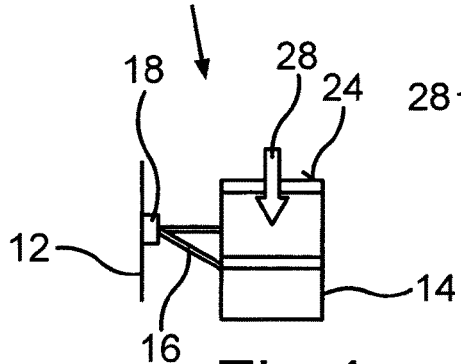
Figure 4B:
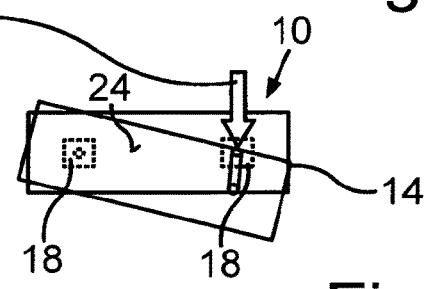

In an analogous manner, the seat cushions can be adjusted in the vertical direction by an actuating force acting on the upper or lower side surface of the operating element 14. If the actuating force acts centrally between the two four-way adjusters, then the seat cushion slides downwards steadily and without rotation. This is depicted in the present case in FIGS. 3a, 3b and 3c, which depict a corresponding deflection of the operating device 10 according to FIGS. 1a, 1b and 1c. An actuating force is exerted on a second side surface 24 of the operating element 14, which is illustrated in the present case by the arrow 26. In order to adjust the inclination of the seat cushion, a vertical actuating force is required, which acts eccentrically on the side surface 24 of the operating element 14. This is depicted in FIGS. 4a, 4b and 4c, which depict a corresponding deflection of the operating device 10 according to FIGS. 1a, 1b and 1c. Presently, the actuating force marked by the arrow 28 acts only on one of the four-way switches. This causes only this four-way switch to be deflected and the other four-way switch remains at rest. Therefore, only a trigger force of one four-way switch must also be overcome.

The mechanical design described above of the operating device 10 has two disadvantages. On the one hand, different trigger forces for the sliding of the seat cushion and the adjustment of the seat cushion inclination result due to the mechanical operating principle. On the other hand it must be ensured that the deflected operating element 14 is autonomously repositioned by the spring force in the four-way adjuster after the actuation. The spring force in the four-way switches must thereby be selected to be so high that the frictional forces in the bearing guides are overcome under all temperature and contamination conditions. From this, however, a force level for the actuation of the operating element 14 results that is so high that operating comfort suffers and the operating device 10 is increasingly in conflict with a force-reduced operation in the motor vehicle.

Turning now to a description of a first embodiment of the invention, FIGS. 5a, 5b and 5c show an operating device 10 to adjust an adjustable seat of a motor vehicle in the first embodiment. FIG. 5a shows a top view, FIG. 5b a front view, and FIG. 5c a side view of the operating device 10. The operating device 10 also comprises an operating element 14 arranged on a carrier element 12. In the present case, the operating element 14 is arranged on the carrier element 12 with a flat carrier 30. The operating element 14 is rigidly or fixedly arranged on the carrier element 12 by the carrier 30. Additionally, a sensor device 18 is arranged on the first side surface 20 of the operating element 14. Preferably, a sensor device 18 is thereby also arranged on the remaining side surfaces of the operating element. The sensor device 18 can be formed to detect a contact of the first side surface 20 from an operating input. Alternatively or additionally, the sensor device 18 can be formed to detect a force acting on the side surface 20 resulting from the operating input. The sensor device 18 can also thereby be formed to detect an amplitude of the force acting on the side surface 20.

In order to adjust the seat cushion horizontally, an actuating force on the first side surface 20 of the operating element 14 is required. A threshold value for the force exerted on the first side surface 20 of the operating element 14 can thereby be set for the emission of a control signal to an adjustment device of a seat. In order to ensure a secure operation, it is additionally advantageous to define an upper threshold value for the force acting on the first side surface 20 of the operating element 14 for the start of the adjustment procedure of the seat and a lower threshold value for the force for the end of the adjustment procedure. The lower threshold value is smaller than the upper threshold value. This prevents natural force fluctuations during operation leading to a constant starting and stopping of the seat adjustment. Such an application of force on the first side surface 20 of the operating element 14 or on the sensor device 18 is depicted in FIGS. 6a, 6b and 6c in which the application of force is illustrated by the arrow 22.

Turning now to a second embodiment of the invention, with the exception of the changes described below, the second embodiment is identical to the first embodiment such that the statements made previously with regard to the first embodiment likewise apply to the second embodiment in this regard.

In order to differentiate between the adjustment of the seat cushion height and the seat cushion inclination in the vertical direction, the contact point of the actuating force on the upper or lower side surface of the operating element 14 must be determined. For this purpose, the sensor device 18 can be segmented. FIGS. 7a, 7b and 7c show an operating device 10 in which the sensor device 18 has three separate sensor surfaces 32. If an actuating force is exerted on the central sensor surface 32 of the sensor device 18, then the seat cushion height is adjusted. If the actuating force acts on one of the outer sensor surfaces 32, then the seat cushion inclination is adjusted. This is presently depicted in FIGS. 7a, 7b and 7c in which an actuating force, identified by the arrow 34, is exerted on the right sensor surface 32 of the sensor device 18.

The description of a third embodiment of the invention occurs below.

With the exception of the changes described below, the third embodiment is identical to the first and second embodiment such that the statements made previously with regard to the first and second embodiment likewise apply to the third embodiment in this regard.

As an alternative to a sensor device 18 having a segmented form, a sensor device 18 can also be used in which the actuating position of the finger can be directly determined. This is illustrated in FIGS. 8a, 8b and 8c. Here, any position regions of the sensor device 18 or of the side surface 24 can be allocated to the height and inclination adjustment.

The description of a fourth embodiment of the invention occurs below.

With the exception of the changes described below, the fourth embodiment is identical to the first, second and third embodiment, such that the statements made previously with regard to the first, second and third embodiment likewise apply to the fourth embodiment in this regard.

FIGS. 9a, 9b and 9c show an operating device 10 in a fourth embodiment in which the operating element 14 is arranged rigidly on the carrier element 12 over corresponding bearing positions 38 by two holding elements 36. Corresponding force sensors or sensor devices 18 are integrated into the bearing positions 38, the force sensors being able to measure horizontal and vertical forces. The actuation position of the finger can be calculated from the reaction forces in the bearing positions 38 and the seat cushion height and the seat cushion inclination can thus be differentiated between.

FIG. 10 shows a perspective depiction of the operating device 10 according to one design of the first to fourth embodiments. The operating device 10 comprises a first operating part 40 allocated to a seat cushion of the seat, a second operating part 42 allocated to a backrest of the seat, and a third operating part 44 allocated to a head support of the seat. Each of the operating parts 40, 42 and 44 can thereby be actuated according to the previously described exemplary embodiments.

Further features or advantages of the pathless and force-sensitive operating device 10 according to the first to fourth embodiments or the design thereof are specified below.

Using the measured actuating force, a multi-step or even continuous input signal is available with which the adjustment speed of the seat can be controlled. The more force the user exerts on the operating element, the quicker the seat moves. Therefore, in particular, a low base adjustment speed can be selected that enables a very accurate positioning of the seat. If a large adjustment path has to be covered, the adjustment procedure can be accelerated by a corresponding increase of the actuating force. Such a control is not possible with the mechanical operating devices of today, as only a discrete switch contact per operating direction is ever available.

Furthermore, during the operation or the adjustment of the seat, corresponding feedback is emitted to the user by means of the operating device. During the actuation of the operating device, a direct feedback results, since the seat is set in motion as a consequence of the operating input on the operating device 10. If the seat, however, is already located at the stop of an adjustment path, and the user then operates in this direction, no function feedback occurs without further measures. This potentially leads to confusion of the user and the assumption of a present functional disruption. This effect can be counteracted by feedback being generated by a very short movement of the seat in the direction opposite to the operation and to the stop, which reports the stop to the user.

A particularly secure operation is ensured by an upper threshold value for the force acting on the first side surface 20 of the operating element 14 for the start of the adjustment procedure of the seat and a lower threshold value for the force for the end or stop of the adjustment procedure being set. The lower threshold value is smaller than the upper threshold value, which prevents natural force fluctuations during operation from leading to a constant starting and stopping of the seat adjustment.

Although the present invention has been described above by means of embodiments with reference to the enclosed drawings, it is understood that various changes and developments can be implemented without leaving the scope of the present invention, as it is defined in the enclosed claims.

Reference is made explicitly to the disclosure of the drawings with regard to further advantages and features of the present invention.

The invention claimed is:

1. An operating device for operating an adjustable seat of a motor vehicle, the operating device comprising:
   a carrier;
   an operating element having a surface;
   at least one holding element coupling the operating element to the carrier at a bearing position on the carrier;
   a sensor configured to detect a size of a force acting on the operating element surface during an operating input and to generate a signal corresponding to the size of the detected force, wherein the sensor is integrated into the bearing position on the carrier;
   and
   a seat adjuster configured to adjust the adjustable seat based on the size of the detected force.

2. The operating device of claim 1, wherein the seat adjuster controls an adjustment speed of the adjustable seat depending on the size of the detected force acting on the surface.

3. The operating device of claim 1, further comprising:
   a second holding element coupling the operating element to the carrier at a second bearing position on the carrier;
   a second sensor configured to detect a size of a force acting on the operating element surface during an operating input and to generate a signal corresponding to the size of the detected force, wherein the sensor and the second sensor detect a position at which the operating input is applied on the surface, and the seat adjuster adjusts the adjustable seat corresponding to the size of the detected force on the detected position detected by the second sensor.

4. The operating element of claim 3, wherein an inclination of the adjustable seat is adjusted using the seat adjuster responsive to the detected position being a predetermined edge region of the surface.

5. The operating device of claim 1, wherein the surface is arranged perpendicularly to an outer surface of the carrier.

6. The operating device of claim 1, wherein the operating element is a first operating element configured to operate a seat cushion of the adjustable seat, and the operating device further comprising a second operating element configured to operate a backrest of the adjustable seat.

7. The operating device of claim 6, further comprising:
   a third operating element configured to operate a head support of the adjustable seat.

8. A method for operating an adjustable seat of a motor vehicle, the method comprising:
   detecting, by a sensor, a size of a force acting on a surface of an operating element during an operating input, wherein the operating element is coupled to a carrier at a bearing position on the carrier and the sensor is integrated into the bearing position on the carrier;
   generating, by the sensor, a signal corresponding to the size of the detected force;
   generating a control signal by processing the signal corresponding to the size of the detected force; and
   adjusting the adjustable seat based on the control signal.

9. The method of claim 8, wherein an adjustment speed of the adjustable seat is controlled depending on the size of the detected force acting on the surface.

10. The method of claim 8, wherein the sensor detects a position at which the operating input is applied on the surface, and the signal corresponding to the size of the detected force is generated depending on the detected position.

11. The method of claim 10, wherein an inclination of the adjustable seat is adjusted when the detected position is a predetermined edge region of the surface.

12. The method of claim 8, wherein the sensor measures horizontal and vertical forces.

13. A device for operating an adjustable seat of a motor vehicle, the device comprising:
   a keycap having a surface;
   a carrier;
   a first holding element coupling the operating element to the carrier at a first bearing position on the carrier;
   a second holding element coupling the operating element to the carrier at a second bearing position on the carrier;
   first and second sensors respectively integrated into the first and second bearing positions on the carrier configured to detect a size of a force acting on the surface of the keycap during an operating input and to generate a signal corresponding to the size of the detected force; and
   a seat adjuster configured to adjust the adjustable seat based on signal corresponding to the size of the detected force.

14. The operating device of claim 1, wherein the sensor is configured to measure horizontal and vertical forces.

15. The operating device of claim 1, wherein the signal corresponding to the size of the detected force is a step of a multi-step input signal corresponding to the detected size of the force.

16. The method of claim 8, wherein the signal corresponding to the size of the detected force is a step of a multi-step input signal corresponding to the detected size of the force.

17. The device of claim 13, wherein the first and second sensors are configured to measure horizontal and vertical forces.

18. The device of claim 13, wherein the signal corresponding to the size of the detected force is a step of a multi-step input signal corresponding to the detected size of the force.

19. The operating device of claim 1, wherein an upper threshold value of the size of the force is employed for starting of the adjustment of the adjustable seat and a lower threshold value of the size of the force is employed for ending or stopping the adjustment of the adjustable seat, wherein the lower threshold value is smaller than the upper threshold value.

20. The method of claim 8, wherein an upper threshold value of the size of the force is employed for starting of the adjustment of the adjustable seat and a lower threshold value of the size of the force is employed for ending or stopping the adjustment of the adjustable seat, wherein the lower threshold value is smaller than the upper threshold value.

* * * * *